US008675385B2

(12) United States Patent
Takaoka et al.

(10) Patent No.: US 8,675,385 B2
(45) Date of Patent: Mar. 18, 2014

(54) SEMICONDUCTOR DEVICE HAVING MEMORY UNIT, METHOD OF WRITING TO OR READING FROM MEMORY UNIT, AND SEMICONDUCTOR DEVICE MANUFACTURING METHOD

(75) Inventors: Hiromichi Takaoka, Kanagawa (JP);
Kenichi Hidaka, Kanagawa (JP);
Hiroshi Tsuda, Kanagawa (JP);
Kiyokazu Ishige, Kanagawa (JP);
Yoshitaka Kubota, Kanagawa (JP);
Takuji Onuma, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 235 days.

(21) Appl. No.: 13/067,773

(22) Filed: Jun. 24, 2011

(65) Prior Publication Data
US 2012/0044741 A1 Feb. 23, 2012

(30) Foreign Application Priority Data

Aug. 19, 2010 (JP) ................................ 2010-183667

(51) Int. Cl.
*G11C 17/08* (2006.01)
(52) U.S. Cl.
USPC .......................................................... 365/96
(58) Field of Classification Search
USPC ........ 365/103, 104, 94, 96, 187, 182, 189.16;
257/368, 209, 530, 50, E27.06,
257/E23.147; 438/197
See application file for complete search history.

(56) References Cited

U.S. PATENT DOCUMENTS

| 5,148,391 | A * | 9/1992 | Zagar .............................. 365/96 |
| 5,299,152 | A * | 3/1994 | Ishihara et al. ................. 365/96 |
| 6,088,282 | A * | 7/2000 | Loughmiller et al. ..... 365/225.7 |
| 6,266,269 | B1 * | 7/2001 | Karp et al. ..................... 365/150 |
| 6,590,797 | B1 * | 7/2003 | Nachumovsky et al. ....... 365/96 |
| 6,667,902 | B2 | 12/2003 | Peng |
| 6,671,040 | B2 | 12/2003 | Fong et al. |
| 6,798,693 | B2 | 9/2004 | Peng |
| 6,822,888 | B2 | 11/2004 | Peng |
| 7,031,209 | B2 | 4/2006 | Wang et al. |
| 7,042,772 | B2 | 5/2006 | Wang et al. |
| 2007/0076463 | A1* | 4/2007 | Keshavarzi et al. ............. 365/96 |
| 2008/0074915 | A1* | 3/2008 | Terzioglu et al. ............... 365/96 |
| 2008/0316852 | A1* | 12/2008 | Matsufuji et al. ........ 365/230.06 |
| 2009/0115021 | A1* | 5/2009 | Moriwaki ..................... 257/530 |
| 2010/0110750 | A1 | 5/2010 | Namekawa |

FOREIGN PATENT DOCUMENTS

| JP | 2009-117461 A | 5/2009 |
| JP | 2010-103563 A | 5/2010 |
| JP | 2010-113746 A | 5/2010 |

* cited by examiner

*Primary Examiner* — Douglas King
(74) *Attorney, Agent, or Firm* — McGinn Intellectual Property Law Group, PLLC

(57) ABSTRACT

A first semiconductor device is formed over a substrate and includes a first insulation film, a first electrode, and a first diffusion layer. A second semiconductor device is formed over a substrate and includes a second insulation film, a second electrode, and a second diffusion layer. The second electrode is coupled to the first electrode. A control transistor allows one of a source and a drain to be coupled to the first electrode and the second electrode, allows the other one of the source and the drain to be coupled to a bit line, and allows a gate electrode to be coupled to a word line. A first potential control line is coupled to the first diffusion layer and controls a potential of the first diffusion layer. A second potential control line is coupled to the second diffusion layer and controls a potential of the second diffusion layer.

26 Claims, 14 Drawing Sheets

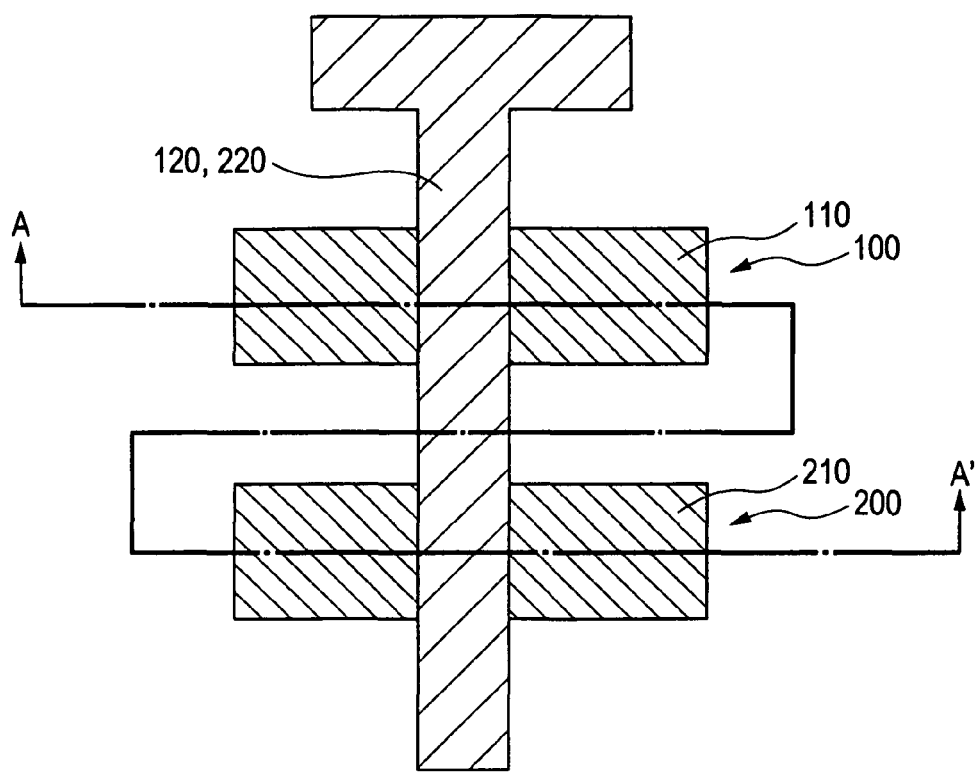
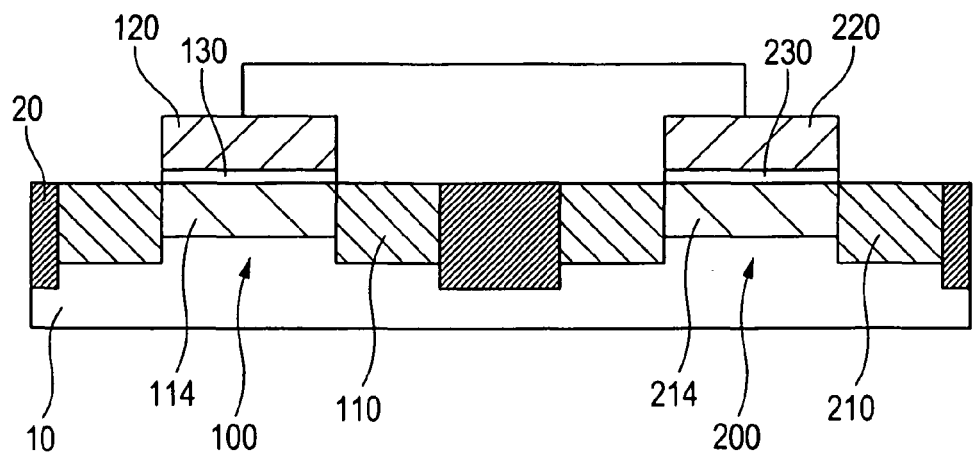

SEMICONDUCTOR DEVICE HAVING MEMORY UNIT, METHOD OF WRITING TO OR READING FROM MEMORY UNIT, AND SEMICONDUCTOR DEVICE MANUFACTURING METHOD

CROSS-REFERENCE TO RELATED APPLICATIONS

The disclosure of Japanese Patent Application No. 2010-183667 filed on Aug. 19, 2010 including the specification, drawings and abstract is incorporated herein by reference in its entirety.

BACKGROUND

The present invention relates to a semiconductor device having a memory unit, a method of writing to or reading from the memory unit, and a semiconductor device manufacturing method.

Memory devices include an unwritable nonvolatile one time programmable (OTP) device. A generally known OTP device uses electromigration or fusion to blow a fuse made of the same material (e.g., polysilicon) as the gate electrode or the same material (e.g., Cu or Al) as the wiring.

Recently, information written to the OTP device is required to be hardly analyzed. The type of memory device that blows the fuse allows image processing to easily analyze whether the fuse is blown. There is the problem of being able to analyze the written information.

In recent years, anti-fuse memory devices are developed as OTP devices. An anti-fuse memory device writes information through insulation breakdown by applying a voltage higher than the breakdown voltage to a gate insulator film or an MIM capacitor insulation film (e.g., see Patent Document 1). Patent Document 2 describes the use of two anti-fuse memory devices to store 2-bit information. Patent Document 3 describes parallel provision of multiple anti-fuse devices to store information of more than two values. The anti-fuse memory device that breaks the gate insulator film makes it difficult for image processing to analyze a location of the insulation film that is broken according to an appropriately selected condition.

Patent Document 1: Japanese Unexamined Patent Publication No. 2010-113746
Patent Document 2: Japanese Unexamined Patent Publication No. 2010-103563
Patent Document 3: Japanese Unexamined Patent Publication No. 2009-117461

SUMMARY

Even an anti-fuse memory device allows written information to be analyzed using a technique such as the voltage contrast method that analyzes the presence or absence of a charge-up effect on electrodes (e.g., gate electrode). The reason follows. Applying a charge to a wire coupled to an electrode stores the charge in the electrode when an insulation film (e.g., gate insulator film) is not broken down. By contrast, a charge applied to the wire coupled to the electrode is routed to a base (e.g., substrate) through the insulation film when the insulation film is broken down. The technique of analyzing a charge-up effect on electrodes can analyze written information.

According to one aspect of the present invention, there is provided a semiconductor device including:

a substrate;
a first semiconductor device including a first insulation film formed over the substrate, a first electrode formed over the first insulation film, a first diffusion layer that is formed over the substrate and is adjacent to at least the first electrode in a planar view;
a second semiconductor device having a second insulation film formed over the substrate, a second electrode that is formed over the second insulation film and is adjacent to the first electrode, and a second diffusion layer that is formed over the substrate and is adjacent to at least the second electrode in a planar view;
a bit line;
a word line;
a control transistor having one of a source and a drain coupled to the first electrode and the second electrode, the other one of a source and a drain coupled to the bit line, and a gate electrode coupled to the word line;
a first potential control section that controls a potential of the first diffusion layer; and
a second potential control section that controls a potential of the second diffusion layer.

According to the aspect of the invention, the first semiconductor device can be used as a memory device that stores 1-bit information depending on whether a short circuit section is formed. State 1 or 0 can be written to the first semiconductor device depending on whether insulation breakdown is caused to the first insulation film. The second semiconductor device can be used as a dummy device for the first semiconductor device. Specifically, the second insulation film is configured not to be broken down when the first insulation film is broken down. The second insulation film is configured to be broken down when the first insulation film is not broken down. According to this configuration, an electric charge applied to the first electrode is not stored even when 1 or 0 is written to the first semiconductor device. This is because the second electrode of the second semiconductor device is coupled to the first electrode of the first semiconductor device. Accordingly, the written information cannot be analyzed through the use of a technique that analyzes the presence or absence of a charge-up effect on electrodes. According to the invention, an offset between the first diffusion layer and the first electrode also signifies that the first diffusion layer and the first electrode are adjacent to each other. Similarly, an offset between the second diffusion layer and the second electrode also signifies that the second diffusion layer and the second electrode are adjacent to each other. The offset is appropriately determined within a range where the above-mentioned effect occurs.

According to another aspect of the present invention, there is provided a method of writing to a memory unit including:
a substrate;
a first semiconductor device including a first insulation film formed over the substrate, a first electrode formed over the first insulation film, a first diffusion layer that is formed over the substrate and is adjacent to at lest the first electrode in a planar view;
a second semiconductor device including a second insulation film formed over the substrate, a second electrode that is formed over the second insulation film and is coupled to the first electrode, a second diffusion layer that is formed over the substrate and is adjacent to at least the second electrode in planar view;
a bit line;
a word line; and
a control transistor having one of a source and a drain coupled to the first electrode and the second electrode, the other one of a source and a drain coupled to the bit line, and a gate electrode coupled to the word line, in which at least one set of the first semiconductor device and the second semiconductor device configures one memory cell;

a first potential is applied to the first diffusion layer, a fourth potential higher than the first potential is applied to the second diffusion layer, a high signal is inputted to the bit line, and a signal is inputted to the word line to turn on the control transistor when 1 is written to the memory cell;

a second potential higher than the first potential is applied to the first diffusion layer, a third potential lower than the second potential and the fourth potential is applied to the second diffusion layer, a high signal is inputted to the bit line, and a signal is inputted to the word line to turn on the control transistor when 1 is written to the memory cell;

a potential difference between the first potential and the high signal and a potential difference between the third potential and the high signal range so as to cause insulation breakdown to the first insulation film and the second insulation film; and a potential difference between the second potential and the high signal and a potential difference between, the fourth potential and the high signal range so as to cause no insulation breakdown to the first insulation film and the second insulation film.

According to still another aspect of the present invention, there is provided a method of reading information from a memory unit including:

a substrate;

a first semiconductor device including a first insulation film formed over the substrate, a first electrode formed over the first insulation film, a first diffusion layer that is formed over the substrate and is adjacent to at least the first electrode in a planar view;

a second semiconductor device including a second insulation film formed over the substrate, a second electrode that is formed over the second insulation film and is coupled to the first electrode, a second diffusion layer that is formed over the substrate and is adjacent to at, least the second electrode in planar view;

a bit line; a word line; and a control transistor having one of a source and a drain coupled to the first electrode and the second electrode, the other one of a source and a drain coupled to the bit line, and a gate electrode coupled to the word line, in which at least one set of the first semiconductor device and the second semiconductor device configures one memory cell;

one of the first insulation film and the second insulation film includes a short circuit section that short-circuits one of the first electrode and the second electrode;

the memory cell stores 1-bit information depending on whether the short circuit section is formed for the first insulation film;

a fifth potential is applied to the first diffusion layer and a sixth potential different from the fifth potential is applied to the bit line; and a potential difference between the fifth potential and the sixth potential ranges so as to cause no insulation breakdown to the first insulation film.

According to yet another aspect of the present invention, there is provided a semiconductor device manufacturing method including the steps of:

forming, over a substrate, a first semiconductor device including a first insulation film, a first electrode formed over the first insulation film, and a first diffusion layer formed over the substrate so as to be adjacent to at least the first electrode in a planar view;

forming, over the substrate, a second semiconductor device including a second insulation film, a second electrode formed over the second insulation film so as to be adjacent to the first electrode, and a second diffusion layer formed over the substrate so as to be adjacent to at least the second electrode in a planar view; and further forming a control transistor; and forming a wiring to couple one of a source and a drain of the control transistor to the first electrode and the second electrode, a bit line coupled to the other one of the source and the drain, and a word line coupled to a gate electrode of the control transistor; and forming, at a given timing, a first potential control section to control a potential of the first diffusion layer and a second potential control section to control a potential of the second diffusion layer.

The present invention can provide a semiconductor device that prevents written information from being analyzed even through the use of a technique that analyzes the presence or absence of a charge-up effect on electrodes.

BRIEF DESCRIPTION OF THE DRAWINGS

FIG. 3 is a plan view showing an example of the semiconductor device whose circuit diagram is shown in FIG. 1;

FIG. 4 is a cross sectional view taken along the line A-A' of FIG. 3;

DETAILED DESCRIPTION

Figure 1:
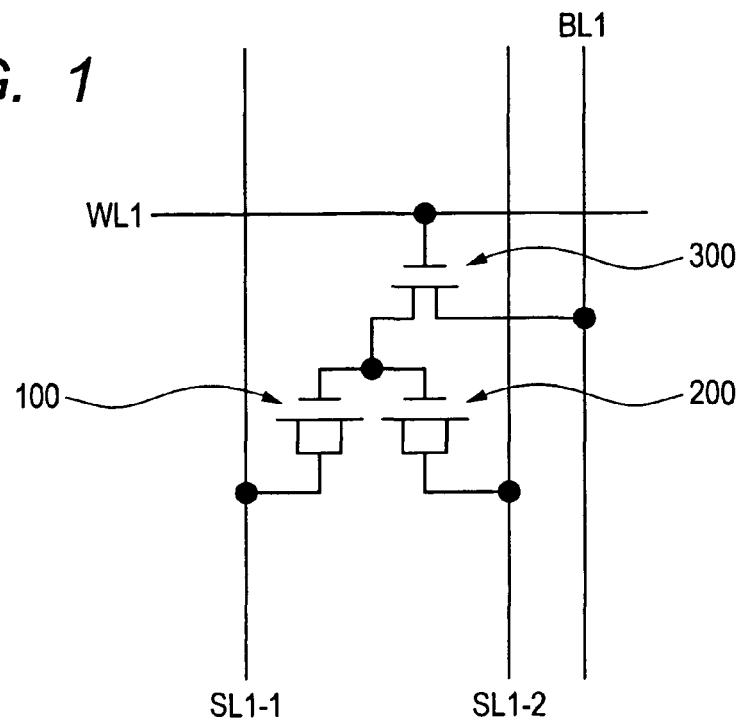
FIG. 1 is a circuit diagram showing a configuration of a semiconductor device according to a first embodiment.

Embodiments of the present invention will be described in further detail with reference to the accompanying drawings. Throughout the drawings, the same parts or components are depicted by the same reference numerals and a detailed description is omitted for simplicity.

First Embodiment

Figure 2:
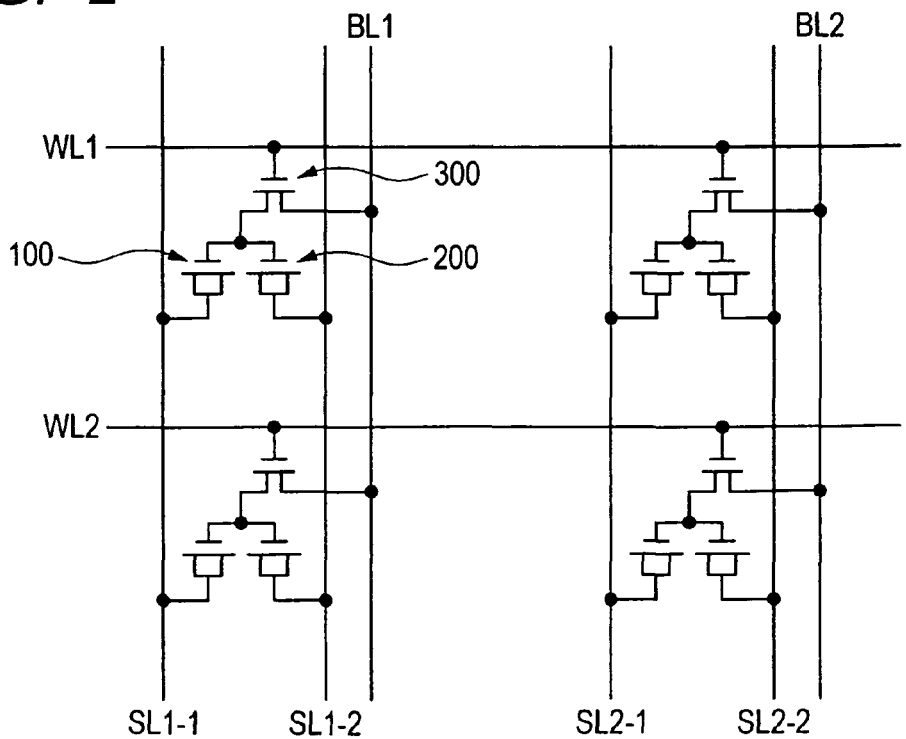
FIG. 2 is another circuit diagram showing a configuration of a semiconductor device according to the first embodiment.

FIGS. 1 and 2 are circuit diagrams showing a configuration of a semiconductor device according to the first embodiment. FIG. 3 is a plan view showing an example of the semiconductor device whose circuit diagram is shown in FIG. 1. FIG. 4 is a cross sectional view taken along the line A-A' of FIG. 3. FIGS. 1 and 2 show main parts of the semiconductor device. The semiconductor device includes a substrate 10 (see FIG. 4), a first semiconductor device 100, a second semiconductor device 200, a bit line BL1, a word line WL1, a control transistor 300, a first potential control line SL1-1 (first potential control section), and a second potential control line SL1-2 (second potential control section).

The first semiconductor device 100 is formed over the substrate 10 and includes a first insulation film 130 (see FIG. 4), a first electrode 120 (see FIG. 4), and a first diffusion layer 110 (see FIG. 4). The first insulation film 130 is formed over the substrate 10. The first electrode 120 is formed over the first insulation film 130. The first diffusion layer 110 is formed over the substrate 10 and is at least adjacent to the first electrode 120 in planar view.

The second semiconductor device 200 is formed over the substrate 10 and includes a second insulation film 230 (see FIG. 4), a second electrode 220 (see FIG. 4), and a second diffusion layer 210 (see FIG. 4). The second insulation film 230 is formed over the substrate 10. The second electrode 220 is formed over the second insulation film 230 and is coupled to the first electrode 120. The second diffusion layer 210 is formed over the substrate 10 and is at least adjacent to the second electrode 220 in planar view.

The first diffusion layer 110 and the first electrode 120 are adjacent to each other even when both are offset. Similarly, the second diffusion layer 210 and the second electrode 220 are adjacent to each other even when both are offset. The offset is appropriately specified within a range of operations to be described later.

As shown in FIG. 1, one of the source and the drain of the control transistor 300 is coupled to the first electrode 120 and the second electrode 220. The other of the source and the drain is coupled to the bit line BL1. The gate electrode is coupled to the word line WL1. The first potential control line SL1-1 is coupled to the first diffusion layer 110 and controls an electric potential of the first diffusion layer 110. The second potential control line SL1-2 is coupled to the second diffusion layer 210 and controls an electric potential of the second diffusion layer 210. The details will be described below.

According to the embodiment, the first semiconductor device 100, the second semiconductor device 200, and the control transistor 300 configure one memory cell. As shown in FIG. 2, memory cells are arranged in a matrix. There are also provided multiple word lines Wl1, WL2, and so on, bit lines BL1, BL2, and so on, first potential control lines SL1-1, SL2-1, and so on, and second potential control lines SL1-2, SL2-2, and so on. The first potential control line SL1-1 and the second potential control line SL1-2 correspond to each other and forms one group. Similarly, the first potential control line SL1-1 and the second potential control line SL1-N (N is an integer) correspond to each other and forms one group.

The first semiconductor device 100 and the second semiconductor device 200 function as MOS transistors. A device separation film 20 separates both devices from each other. The first insulation film 130 and the second insulation film 230 are equivalent to gate insulator films. The first electrode 120 and the second electrode 220 are equivalent to gate electrodes. The first diffusion layer 110 and the second diffusion layer 210 are equivalent to the source and the drain. The first diffusion layer 110 is not formed below the first electrode 120. The second diffusion layer 210 is not formed below the second electrode 220. A low-concentration diffusion layer 114 of the same conductivity type as the first diffusion layer 110 is formed over the substrate 10 below the first diffusion layer 110. A low-concentration diffusion layer 214 of the same conductivity type as the second diffusion layer 210 is formed over the substrate 10 below the second diffusion layer 210. The low-concentration diffusion layers 114 and 214 may or may not be formed. The first insulation film 130 and the second insulation film 230 are thinner than the gate insulator film of the control transistor 300. According to the example shown in the drawings, the control transistor 300 corresponds to a first conductivity type (e.g., n-type). The first semiconductor device 100 and the second semiconductor device 200 correspond to the first conductivity type (e.g., n-type) equal to the control transistor 300.

The first semiconductor device 100 functions as a memory device. The second semiconductor device 200 functions as a dummy device for the first semiconductor device 100. At least one set of the first semiconductor device 100 and the second semiconductor device 200 configures a memory cell. After one of 1 and 0 is written to the memory cell, one of the first insulation film 130 and the second insulation film 230 always includes a short circuit section that short-circuits the substrate 10 to the first electrode 120 or the second electrode 220. In more detail, the first semiconductor device 100 stores 1-bit information depending on whether the short circuit section (insulation breakdown section) is formed over the first insulation film 130. No short circuit section is formed for the second insulation film 230 of the second semiconductor device 200 when the short circuit section is formed for the first insulation film 130. The short circuit section is formed for the second insulation film 230 thereof when no short circuit section is formed for the first insulation film 130. Two or more sets of the first semiconductor device 100 and the second semiconductor device 200 may be used to configure one memory cell and store 1-bit information. In this case, the first semiconductor devices 100 in the memory cells (e.g., memory cells coupled to SL1-1 and SL1-2 in FIG. 2) may be coupled parallel. The first semiconductor devices 100 may store 1-bit information. Also in this case, each of the semiconductor devices 100 stores information.

Figure 5:
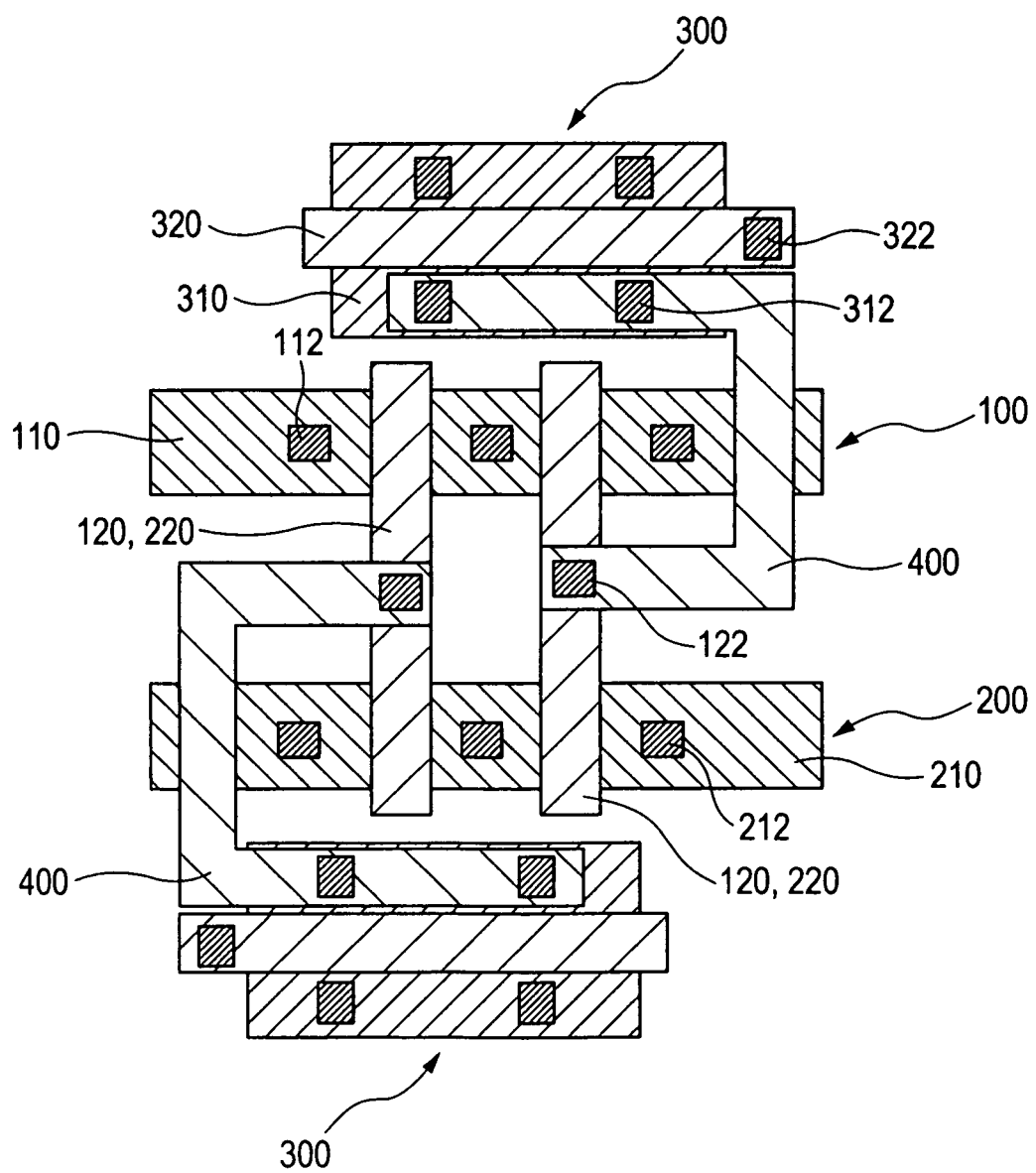
FIG. 5 is a plan view showing another example of the semiconductor device shown in FIG. 1.

FIG. 5 is a plan view showing another example of the semiconductor device shown in FIG. 1. In FIG. 5, one set of the first semiconductor device 100 and the second semiconductor device 200 configures a memory cell. FIG. 5 shows two memory cells. According to the example of FIG. 5, the first diffusion layer 110 of the first semiconductor device 100 and the second diffusion layer 210 of the second semiconductor device 200 are rectangularly shaped in planar view and are provided adjacent and parallel to each other. The first electrode 120 and the second electrode 220 are formed as one electrode and extend in a direction orthogonal to the first diffusion layer 110 and the second diffusion layer 210 so as to cross the first diffusion layer 110 and the second diffusion layer 210. The first diffusion layer 110 is coupled to the first potential control line SL1-1 (shown in FIGS. 1 and 2) through a contact 112. The second diffusion layer 210 is coupled to the second potential control line SL1-2 (shown in FIGS. 1 and 2) through a contact 212. According to the embodiment, the first electrode 120 divides the first diffusion layer 110 into multiple regions in planar view. The contact 112 is formed in each of the regions of the first diffusion layer 110 divided by the first electrode 120. Similarly, the second electrode 220 divides the second diffusion layer 210 into multiple regions in planar view. The contact 212 is formed in each of the regions of the second diffusion layer 210 divided by the second electrode 220.

The first electrode 120 and the second electrode 220 are coupled to wiring 400 as an upper layer through the contact 122. The contact 122 is positioned between the first diffusion layer 110 and the second diffusion layer 210 in planar view. The wiring 400 is coupled to a diffusion layer 310 as the source and the drain for the control transistor 300 through a contact 312. The diffusion layer 310 corresponds to the same conductivity type as that for the first diffusion layer 110 and the second diffusion layer 210. A gate electrode 320 of the control transistor 300 is coupled to the word line WL1 (shown in FIGS. 1 and 2) through a contact 322. The two memory cells shown in FIG. 5 may be coupled to the same word line or different word lines. Similarly, the two memory cells may be coupled to the same bit line or different bit lines.

The following describes a manufacturing method of the semiconductor device according to the embodiment. The device separation film 20 and the low-concentration diffusion layers 114 and 214 are formed over the substrate 10. The first insulation film 130 and the second insulation film 230 are then formed. A gate insulator film for the control transistor 300 is formed. A conductive film such as a polysilicon film is formed over the first insulation film 130, the second insulation film 230, and the gate insulator film of the control transistor 300 and then is selectively removed. As a result, the first electrode 120, the second electrode 220, and the gate electrode 320 of the control transistor 300 are formed. Impurity of the first conductivity type is injected to the substrate 10 to form the diffusion layer 310, the first diffusion layer 110, and the second diffusion layer 210. As a result, the first semiconductor device 100, the second semiconductor device 200, and the control transistor 300 are formed. A multilayer wiring layer is then formed. Forming the multilayer wiring layer forms the contacts 112, 212, 122, 312, and 322, the wiring 400, the bit line BL1, the word line WL1, the first potential control line SL1-1, and the second potential control line SL1-2.

The following describes how to write information to the memory cell with reference to FIGS. 6A, 6B, 7A, and 7B. According to the embodiment, one of first and second potentials is applied to the first potential control line SL1-1. The second potential is higher than the first potential. One of third and fourth potentials is applied to the second potential control line SL1-2. The third potential is lower than the second potential. The fourth potential is higher than the third potential. A potential difference between a high signal input to the bit line BL1 and the first potential ranges so as to cause insulation breakdown to the first insulation film 130. A potential difference between a high signal input to the bit line BL1 and the third potential ranges so as to cause insulation breakdown to the second insulation film 230. A potential difference between the second potential and the high signal ranges so as to cause no insulation breakdown to the first insulation film 130. A potential difference between the fourth potential and the high signal ranges so as to cause no insulation breakdown to the second insulation film 230. The insulation breakdown of the first insulation film 130 requires a specified time lapse after the potential is applied to the bit line BL1 and the first diffusion layer 110. The time lapse depends on a potential difference between the high signal applied to bit line BL1 and the first potential. Similarly, the insulation breakdown of the second insulation film 230 requires a specified time lapse after the potential is applied to the bit line BL1 and the second diffusion layer 210. The time lapse depends on a potential difference between the high signal applied to bit line BL1 and the third potential. To simplify the control circuit configuration, the first potential preferably equals the third potential like a ground potential, for example. The second potential preferably equals the fourth potential. A read/write control section (not shown in FIGS. 6A, 6B, 7A, and 7B) controls potentials of the first potential control line SL1-1 and the second potential control line SL1-2.

Figure 6A:
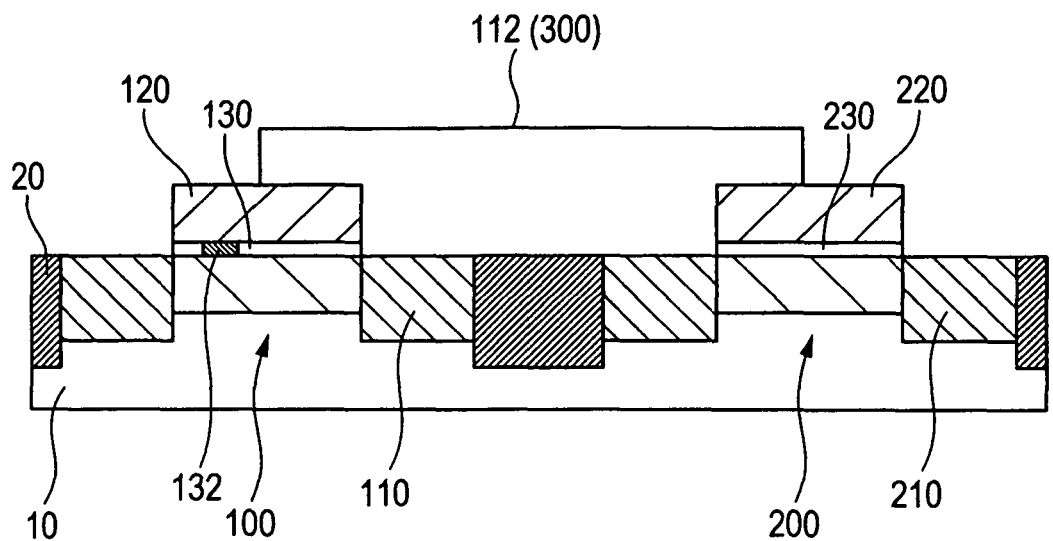
FIG. 6A and FIG. 6B illustrate a method of writing information to a memory cell.
Figure 6B:
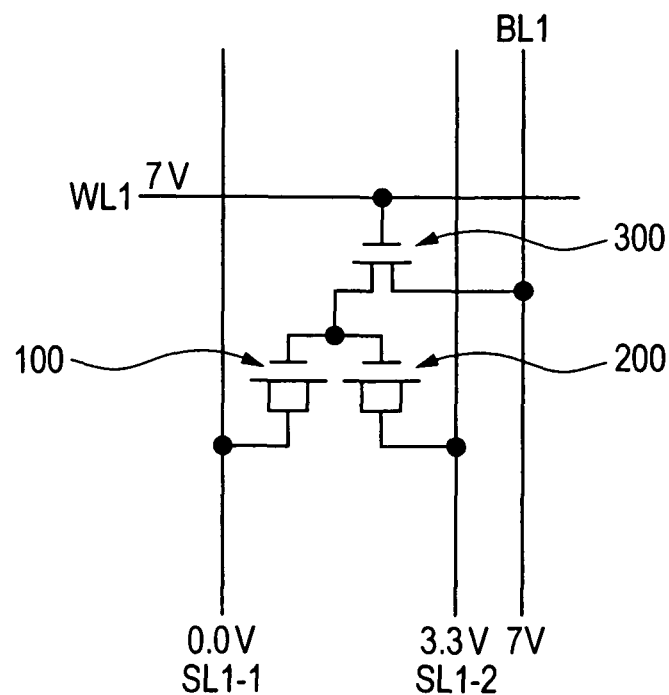

The following describes how to write "1" to the memory cell including the first semiconductor device 100 and the second semiconductor device 200 with reference to FIGS. 6A and 6B. According to the embodiment, "1" indicates the state where the first insulation film 130 is broken down to form a short circuit section 132. FIG. 6B shows how to enable this state. The read/write control section applies the first potential (ground potential 0.0 V in the example of FIG. 6B) to the first diffusion layer 110 through the first potential control line SL1-1 and applies the fourth potential (3.3 V in the example of FIG. 6B) to the second diffusion layer 210 through the second potential control line SL1-2. The read/write control section inputs a high signal (7 V in the example of FIG. 6B) to the word line WL1. As a result, the control transistor 300 turns on. The potential of the bit line BL1 is applied to the first electrode 120 of the first semiconductor device 100 and the second electrode 220 of the second semiconductor device 200.

A high potential signal (7 V in the example of FIG. 6B) is inputted to the bit line BL1. The high signal has the same potential as that for the high signal input to the work line. As mentioned above, the potential difference (7 V) between the first potential (0.0 V) and the high signal (7 V) input to the bit line BL1 ranges so as to cause insulation breakdown to the first insulation film 130. The potential difference (3.7 V) between the fourth potential (3.3 V) and the high signal (7 V) ranges so as to cause no insulation breakdown to the second insulation film 230. Consequently, the short circuit section 132 is formed for the first insulation film 130 only.

As mentioned above, the gate insulator film for the control transistor 300 is thicker than the first insulation film 130 and the second insulation film 230. Therefore, a write process causes no insulation breakdown to the gate insulator film of the control transistor 300.

Figure 7A:
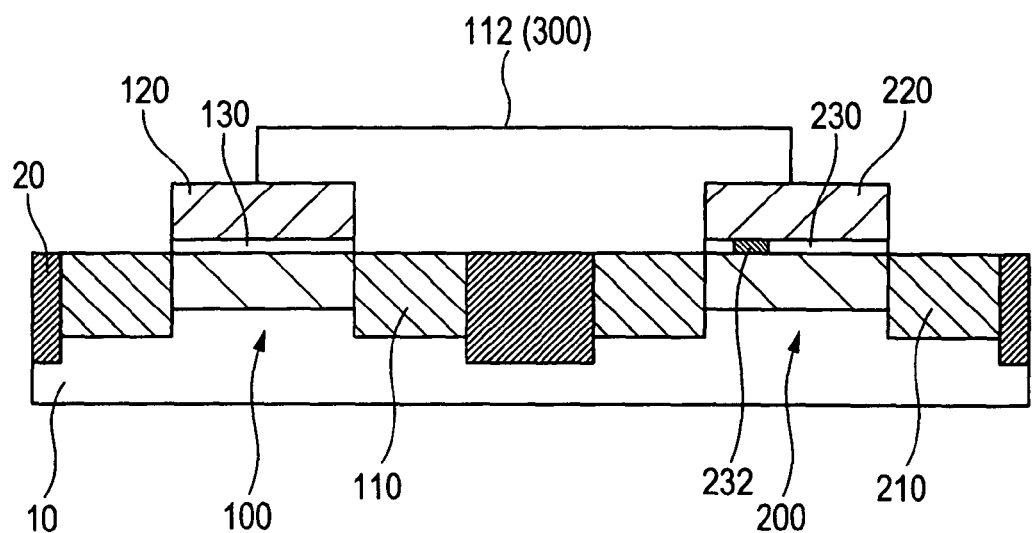
FIG. 7A and FIG. 7B illustrate a method of writing information to a memory cell.
Figure 7B:
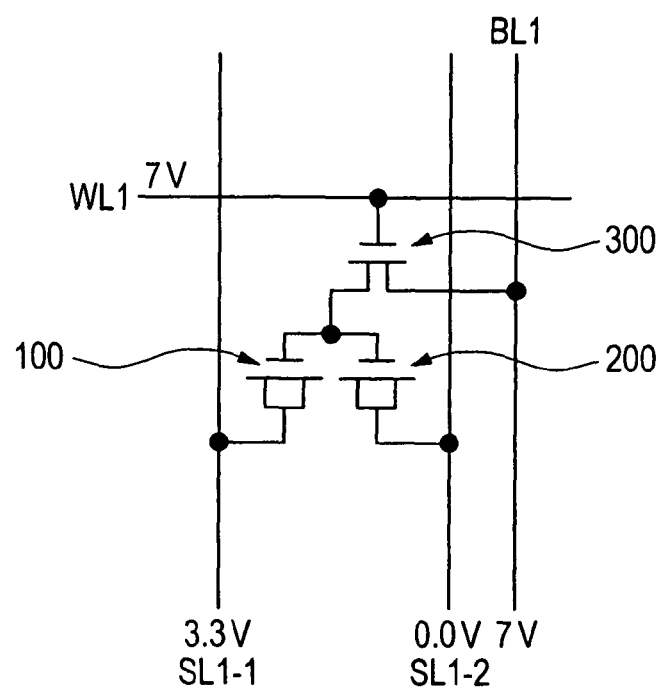

The following describes how to write "0" to the memory cell with reference to FIGS. 7A and 7B. According to the embodiment, "0" indicates the state where the first insulation film 130 is not subject to insulation breakdown and the short circuit section 132 shown in FIG. 6A is not formed. FIG. 7B shows how to enable this state. The read/write control section applies the second potential (3.3 V in the example of FIG. 7B) to the first diffusion layer 110 through the first potential control line SL1-1 and applies the third potential (ground potential 0.0 V in the example of in the example of FIG. 7B) to the second diffusion layer 210 through the second potential control line SL1-2. The read/write control section inputs a high signal (7 V in the example of FIG. 7B) to the word line WL1. As a result, the control transistor 300 turns on. The potential of the bit line BL1 is applied to the first electrode 120 of the first semiconductor device 100 and the second electrode 220 of the second semiconductor device 200.

A high signal (7 V in the example of FIG. 7B) is inputted to the bit line BL1. As mentioned above, the potential difference (3.7 V) between the second potential (3.3 V) and the high signal (7 V) input to the bit line BL1 ranges so as to cause no insulation breakdown to the first insulation film 130. The potential difference (7 V) between the third potential (0.0 V) and the high signal (7 V) ranges so as to cause insulation breakdown to the second insulation film 230. Consequently, a short circuit section 232 is formed for the second insulation film 230 only.

Figure 8:
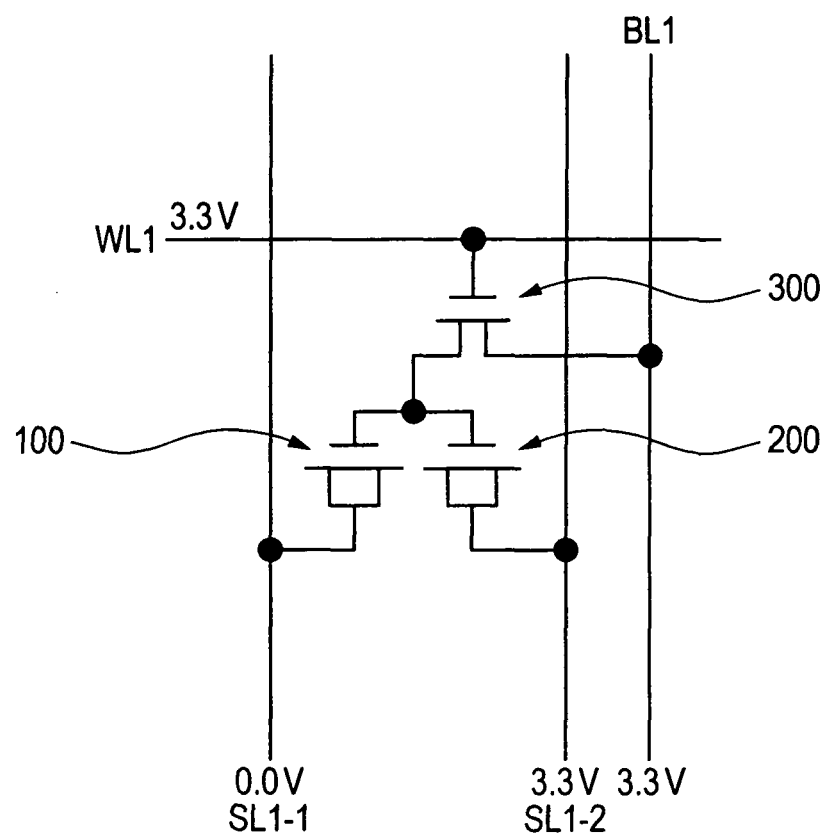
FIG. 8 illustrates a method of reading data written to a memory cell.

The following describes how to read data written to the memory cell with reference to FIG. 8. Reading data from the first semiconductor device 100 applies a fifth potential to the first potential control line SL1-1 and a six potential to the bit line BL1. A potential difference between the fifth and sixth potentials ranges so as to cause no insulation breakdown to the first insulation film 130. Causing no insulation breakdown signifies that no insulation breakdown occurs within a time period needed to read information. In this state, applying a high signal to the word line WL1 turns on the control transistor 300. The short circuit section 132 is formed for the first insulation film 130 when "1" is written to the memory cell. Consequently, the first potential control line SL1-1 is short-circuited to the bit line BL1 through the short circuit section 132 and the first electrode 120. The potential of the bit line BL1 becomes lower than the sixth potential. The short circuit section 134 is not formed for the first insulation film 130 when "0" is written to the memory cell. The potential of the bit line BL1 remains equal to the sixth potential. Detecting a change in the potential of the bit line BL1 can read data written to the memory cell.

In the example of FIG. 8, the fifth potential is 0.0 V (ground potential) and equals the first potential. The sixth potential is 3.3 V and equals the second potential. According to the embodiment, the same potential as that for the bit line BL is applied to the second potential control line SL1-2. A high signal input to the word line WL1 during reading has the same potential as that applied to the bit line BL1 during reading. In this manner, the second semiconductor device 200 can prevent a current from being applied to the second potential control line SL1-2. A potential differing from that applied to the bit line BL may be applied to the second potential control line SL1-2. The high signal input to the word line WL1 during reading may have a potential differing from that input to the bit line BL1 during reading.

Figure 9:
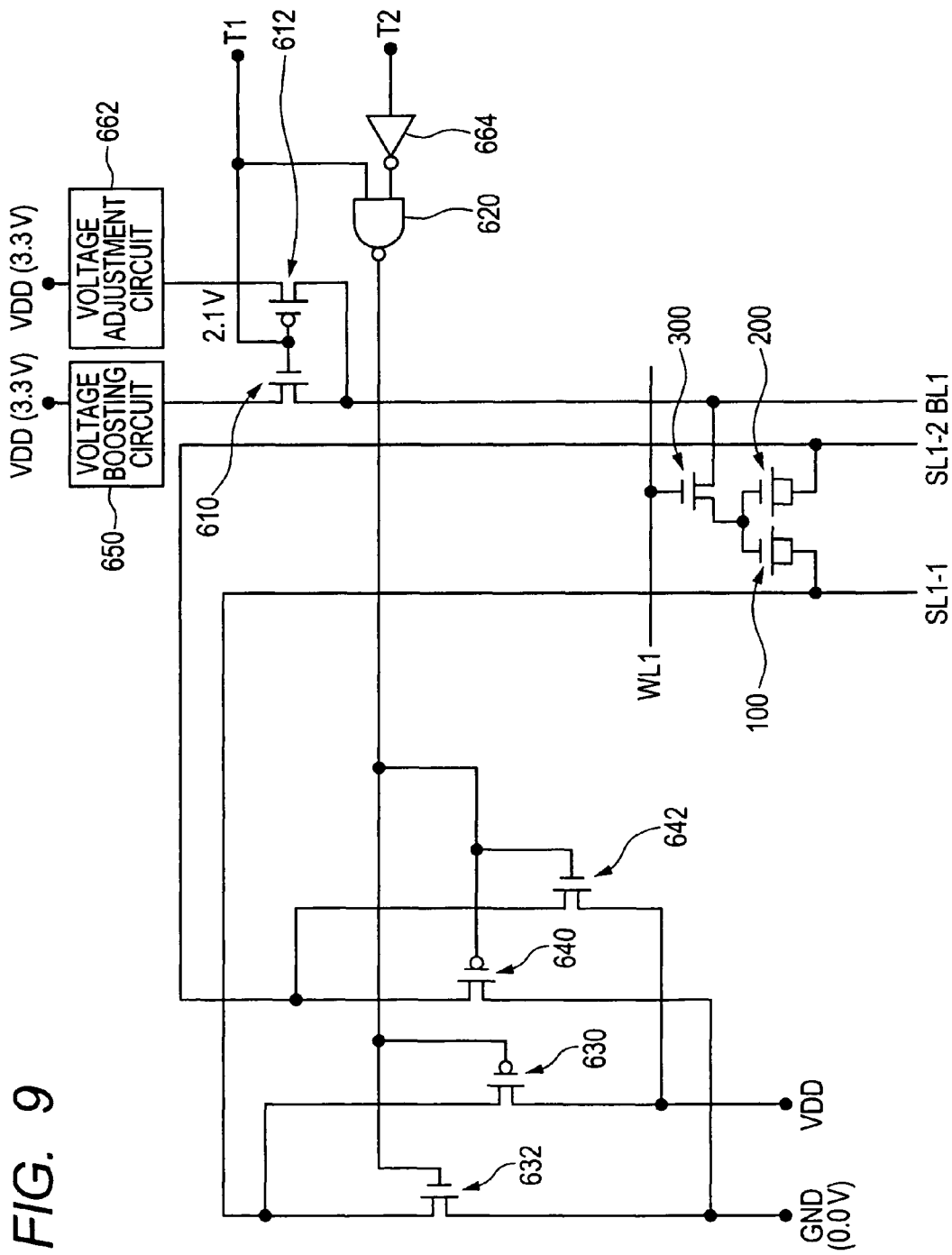
FIG. 9 is a circuit diagram exemplifying a configuration of a read/write control section.

FIG. 9 is a circuit diagram exemplifying a configuration of the read/write control section. In the example of FIG. 9, the read/write control section includes a voltage boosting circuit 650. The voltage boosting circuit 650 is coupled to a power supply line VDD and boosts a power supply potential (e.g., 3.3 V) to be input to the power supply line VDD up to a higher voltage (e.g., 7 V). Output from the voltage boosting circuit 650 is inputted to one of the source and the drain of the n-type transistor 610, for example. The other one of the source and the drain of the transistor 610 is coupled to the bit line BL1. The voltage boosting circuit 650 may be omitted and a potential higher than the power supply potential may be input from the outside.

The gate electrode of the transistor 610 is coupled to a write control line T1. The write control line T1 is also coupled to the gate electrode of a p-type transistor 612, for example. One of the source and the drain of the transistor 612 is coupled to a voltage adjustment circuit 662 and the power supply line VDD through a resistor, for example. The other one of the source and the drain of the transistor 612 is coupled to the bit line BL1.

The write control line T1 is coupled to one input of a NAND gate 620. A write data input line T2 is coupled to the other input of the NAND gate 620 through an inverter 664. An output from the NAND gate 620 is coupled to the gate electrode of a p-type transistor 630, the gate electrode of an n-type transistor 632, the gate electrode of a p-type transistor 640, and the gate electrode of an n-type transistor 642. The NAND gate 620 along with the inverter 664 outputs a high signal when the write control line T1 is set to a low signal regardless of whether the write data input line T2 is set to the low or high signal. The NAND gate 620 outputs the signal from the write data input line T2 when the write control line T1 is set to the high signal.

The power supply potential VDD is applied to one of the source and the drain of the transistor 630. The ground potential is applied to one of the source and the drain of the transistor 632. The other one of the source and the drain of the transistor 630 and the other one of the source and the drain of the transistor 632 are coupled to the first potential control line SL1-1. The ground potential is applied to one of the source and the drain of the transistor 640. The power supply potential VDD is applied to one of the source and the drain of the transistor 642. The other one of the source and the drain of the transistor 640 and the other one of the source and the drain of the transistor 642 are coupled to the second potential control line SL1-2.

In this configuration, a high signal is inputted to both the write control line T1 and the write data input line T2 when "1" is written to the memory cell.

Inputting a high signal to the write control line T1 inputs a high signal to the gate electrodes of the transistors 610 and 612. Of these transistors, only the transistor 610 turns on to input an output potential from the voltage boosting circuit 650 to the bit line BL1.

The inverter 664 converts a high signal input to the write data input line T2 into a low signal that is then input to the NAND gate 620. Consequently, the NAND gate 620 inputs a high signal to the gate electrodes of all the transistors 630, 632, 640, and 642. As a result, only the transistors 632 and 642 turn on. The ground potential is applied to the first potential control line SL1-1. The power supply potential VDD is applied to the second potential control line SL1-2. In this state, a high signal is inputted to the word line WL1 to turn on the control transistor 300. The potential of the bit line BL1 is then input to the first electrode 120 of the first semiconductor device 100. The ground potential is applied to the first potential control line SL1-1. Accordingly, the first insulation film 130 of the first semiconductor device 100 is broken down to write "1" to the memory cell.

The potential of the bit line BL1 is also input to the second electrode 220 of the second semiconductor device 200. The power supply potential is applied to the second potential control line SL1-2. The potential difference between the power supply potential and the bit line BL1 ranges so as to cause no insulation breakdown to the second insulation film 230. The second insulation film 230 of the second semiconductor device 200 is not broken down.

On the other hand, a high signal is inputted to the write control line T1 and a low signal is inputted to the write data input line T2 when "0" is written to the memory cell.

Inputting a high signal to the write control line T1 inputs a high signal to the gate electrodes of the transistors 610 and 612. Of these transistors, only the transistor 610 turns on to input an output potential from the voltage boosting circuit 650 to the bit line BL1. The high signal is also input to the transistor 612. However, the transistor 612 does not turn on because it is p-type.

The inverter 664 converts a low signal input to the write data input line T2 into a high signal that is then input to the NAND gate 620. Consequently, a low signal is inputted to the gate electrodes of all the transistors 630, 632, 640, and 642. As a result, only the transistors 630 and 640 turn on. The power supply potential is applied to the first potential control line SL1-1. The ground potential is applied to the second potential control line SL1-2. In this state, a high signal is inputted to the word line WL1 to turn on the control transistor 300. The potential of the bit line BL1 is then input to the first electrode 120 of the first semiconductor device 100. The power supply potential is applied to the first potential control line SL1-1. The potential difference between the power supply potential and the bit line BL ranges so as to cause no insulation breakdown to the first insulation film 130. The first insulation film 130 of the first semiconductor device 100 is not broken down.

The potential of the bit line BL1 is also input to the second electrode 220 of the second semiconductor device 200. The ground potential is applied to the second potential control line SL1-2. The second insulation film 230 of the second semiconductor device 200 is broken down to form the short circuit section 232 (see FIGS. 7A and 7B).

A low signal is inputted to the write control line T1 when information is read from the first semiconductor device 100. Of the transistors 610 and 612, only the transistor 612 turns on when the low signal is inputted to the write control line T1. Turning on the transistor 612 applies a potential (e.g., 2.1 V) to the bit line BL1. This potential is reduced from the power supply potential VDD (e.g., 3.3 V) through the voltage adjustment circuit 662.

Inputting a low signal to the write control line T2 outputs a high signal from the NAND gate 620. Of the transistors 630 and 632, only the transistor 632 turns on when the high signal is outputted from the NAND gate 620. Turning on the transistor 632 grounds the first potential control line SL1-1. In this state, information can be read from the memory cell when a high signal is inputted to the word line WL1 to turn on the control transistor 300 and determine how much potential is applied to the bit line BL1. Information can be also read from the memory cell when a current flowing through the bit line BL1 is detected.

Figure 10A:
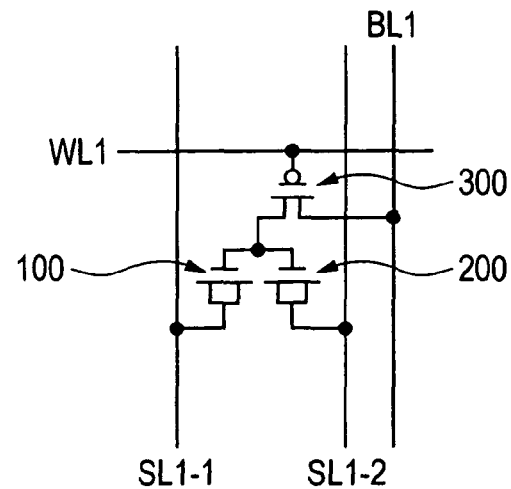
FIG. 10A, FIG. 10B, and FIG. 10C are circuit diagrams showing a modification of FIG. 1.
Figure 10B:
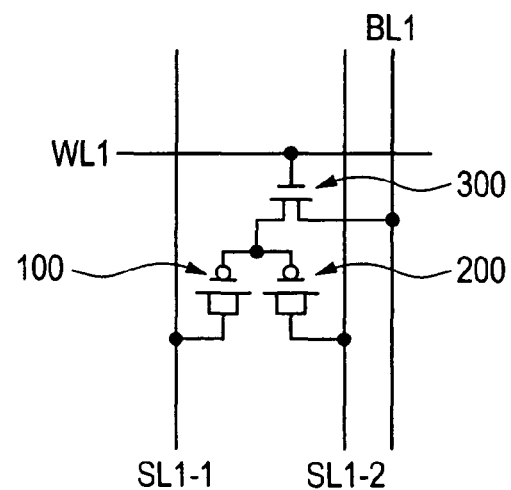
Figure 10C:
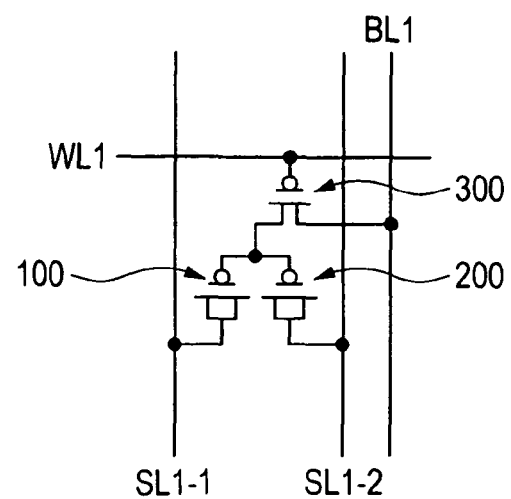

Including FIG. 9, there has been described that the control transistor 300, the first diffusion layer 110, and the second diffusion layer 210 are n-type. As shown in FIG. 10A, the control transistor 300 may be p-type. As shown in FIG. 10B, the control transistor 300 may be n-type and the first diffusion layer 110 and the second diffusion layer 210 may be p-type. As shown in FIG. 10C, the control transistor 300, the first diffusion layer 110, and the second diffusion layer 210 may be all p-type.

Figure 11A:
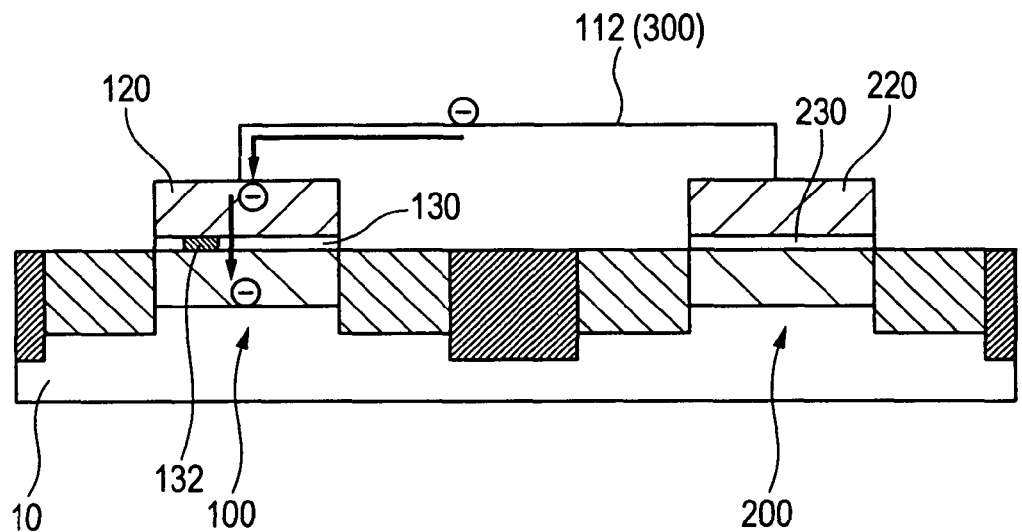
FIG. 11A and FIG. 11B illustrate operations and effects of the first embodiment.

Operations and effects of the embodiment will be described with reference to FIGS. 11A and 11B. FIG. 11A shows that "1" is written to the memory cell. In this case, the short circuit section 132 is formed for the first insulation film 130 of the first semiconductor device 100. For example, let us suppose that the surface of the semiconductor device is polished to expose the first electrode 120 and the second electrode 220 and an electric charge is applied to the first electrode 120 or the second electrode 220. The electric charge is routed to the substrate 10 through the short circuit section 132. Accordingly, the first electrode 120 does not charge up.

Figure 11B:
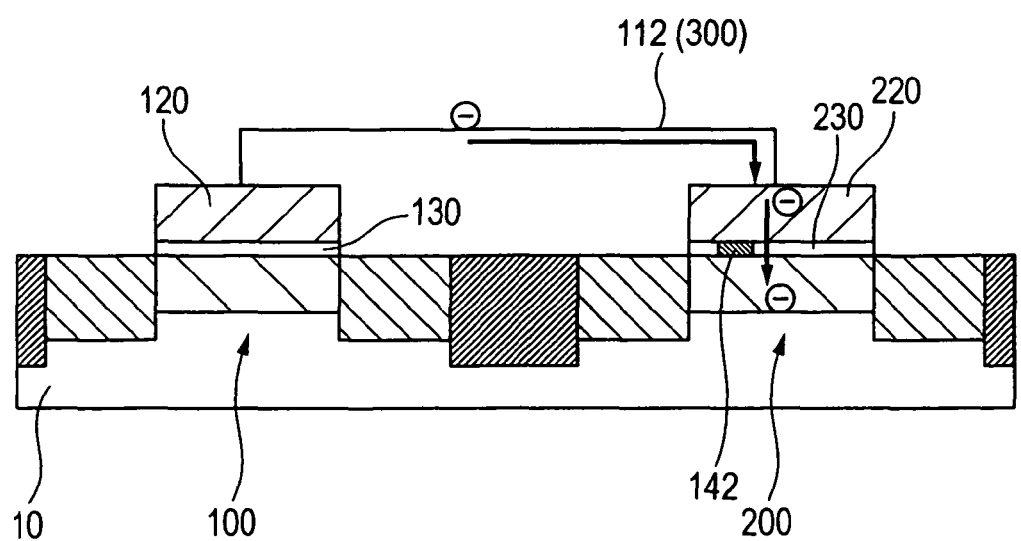

FIG. 11B shows that "0" is written to the memory cell. In this case, the short circuit section 132 is not formed for the first insulation film 130 of the first semiconductor device 100. Instead, a short circuit section 332 is formed for the second insulation film 230 of the second semiconductor device 200. The first electrode 120 and the second electrode 220 are formed as one electrode and activate a conduction state. A charge, when applied to a wiring coupled to the first electrode 120 or the second electrode 220, is routed to the substrate 10 through the second electrode 220 and the short circuit section 232. Consequently, the first electrode 120 is not charged up.

Information written to the memory cell cannot be analyzed even through the use of a technique that analyzes the presence or absence of a charge-up event on the first electrode 120.

Second Embodiment

Figure 12:
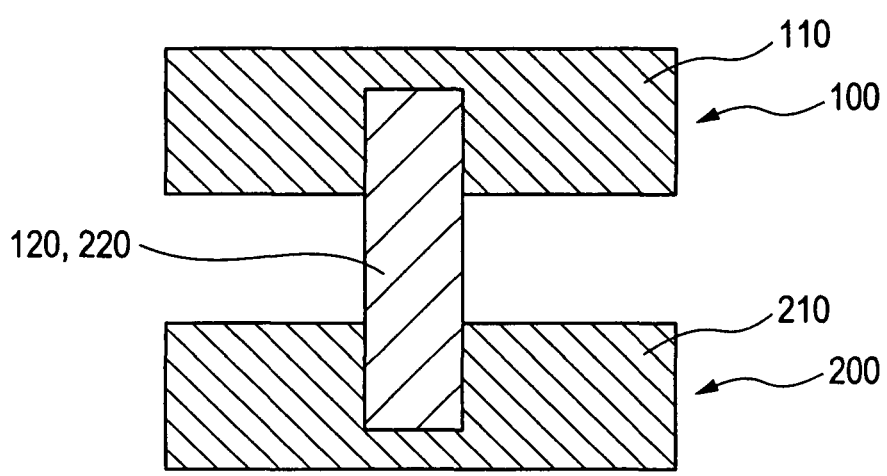
FIG. 12 is a plan view showing a configuration of a semiconductor device according to a second embodiment.
Figure 13:
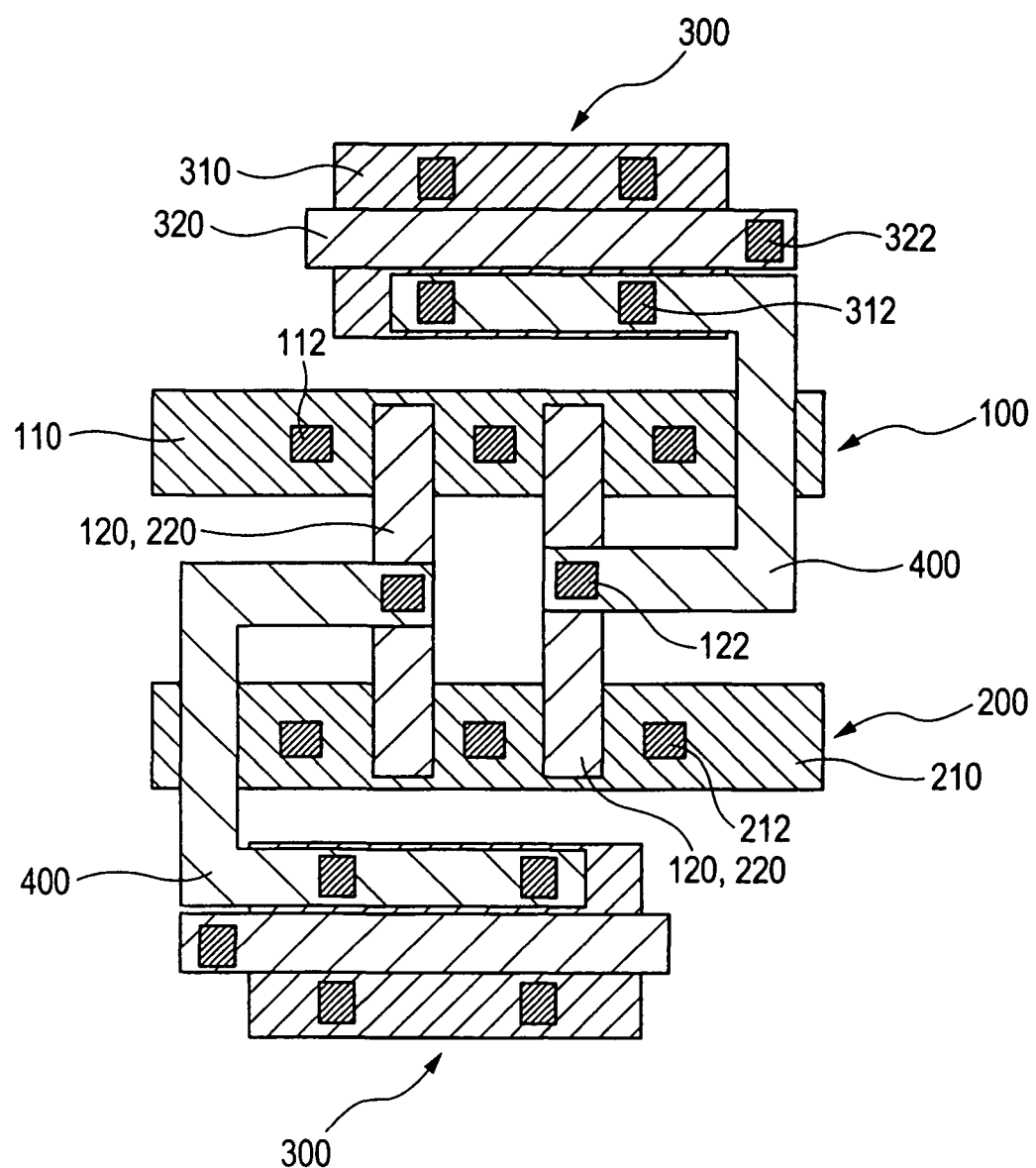
FIG. 13 is another plan view showing a configuration of a semiconductor device according to the second embodiment.

FIG. 12 is a plan view showing a configuration of a semiconductor device according to the second embodiment and corresponds to FIG. 3 of the first embodiment. FIG. 13 is a plan view showing a configuration of a semiconductor device according to the second embodiment and corresponds to FIG. 5 of the first embodiment. The semiconductor device according to the second embodiment is configured similarly to the semiconductor device according to the first embodiment except the following. The first electrode 120 and the second electrode 220 do not cross the first diffusion layer 110 and the second diffusion layer 210 in planar view. Ends of the first electrode 120 and the second electrode 220 are positioned over the first diffusion layer 110 and the second diffusion layer 210.

The second embodiment can provide the same effects as the first embodiment. The second embodiment can miniaturize the semiconductor device because the first electrode 120 and the second electrode 220 do not cross the first diffusion layer 110 and the second diffusion layer 210 in planar view.

Figure 14:
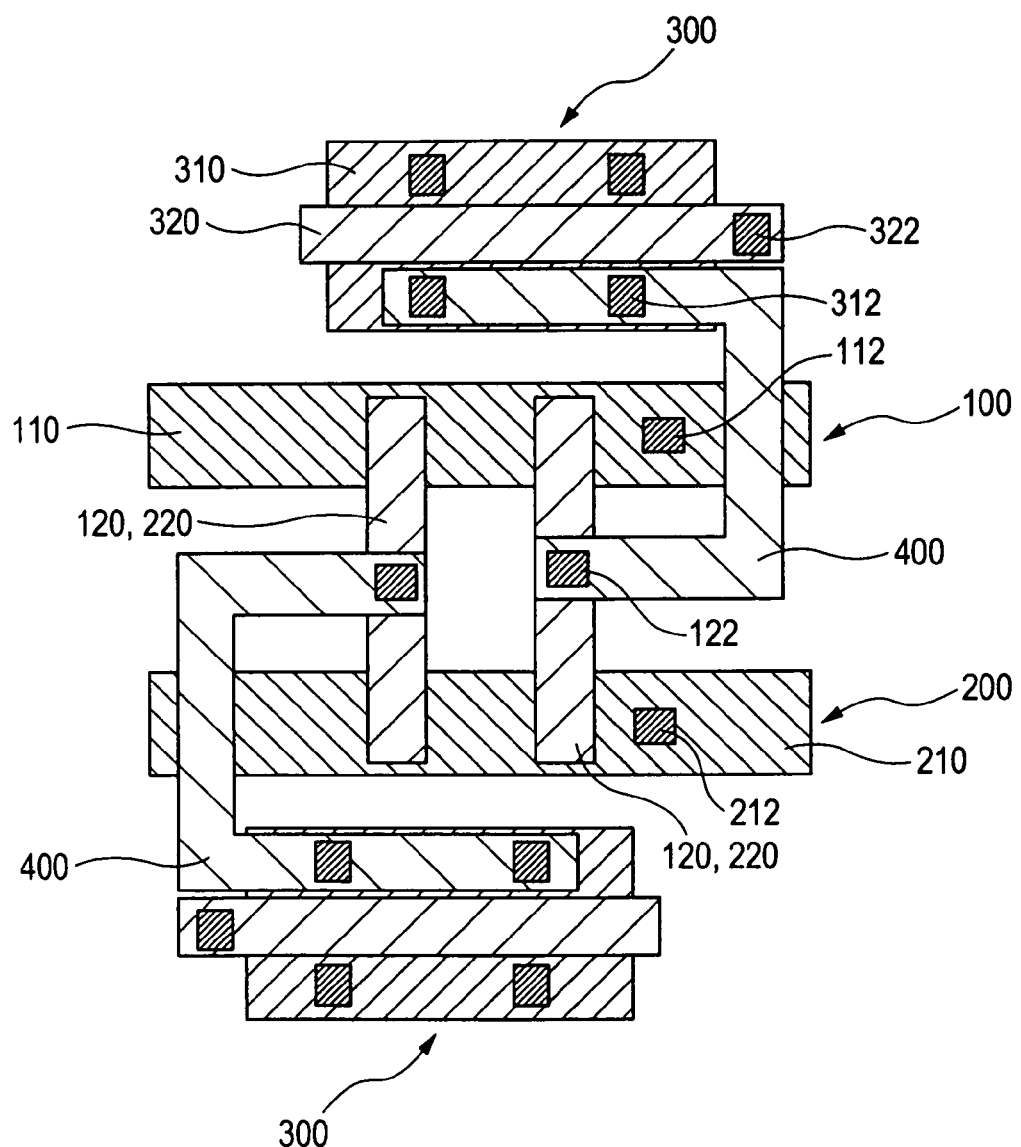
FIG. 14 is a plan view showing a modification of FIG. 13.

According to the second embodiment as shown in FIG. 14, the contact 112 need not be formed for all the regions of the first diffusion layer 110 divided by the first electrode 120. Similarly, the contact 212 need not be formed for all the regions of the second diffusion layer 210 divided by the second electrode 220.

Third Embodiment

Figure 15:
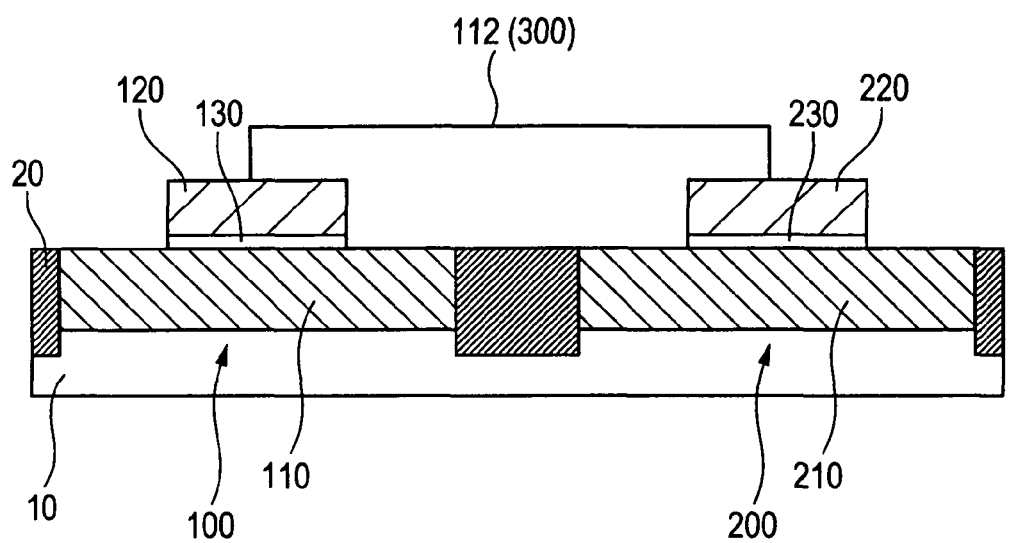
FIG. 15 is a sectional view showing a configuration of a semiconductor device according to a third embodiment.

FIG. 15 is a sectional view showing a configuration of a semiconductor device according to the third embodiment. The semiconductor device according to the third embodiment is configured similarly to the semiconductor device according to the first or second embodiment except the following. The low-concentration diffusion layers 114 and 214 are not formed. Instead, the first diffusion layer 110 and the second diffusion layer 210 are also formed below the first electrode 120 and the second electrode 220.

The third embodiment can provide the same effects as the first embodiment.

Fourth Embodiment

Figure 16:
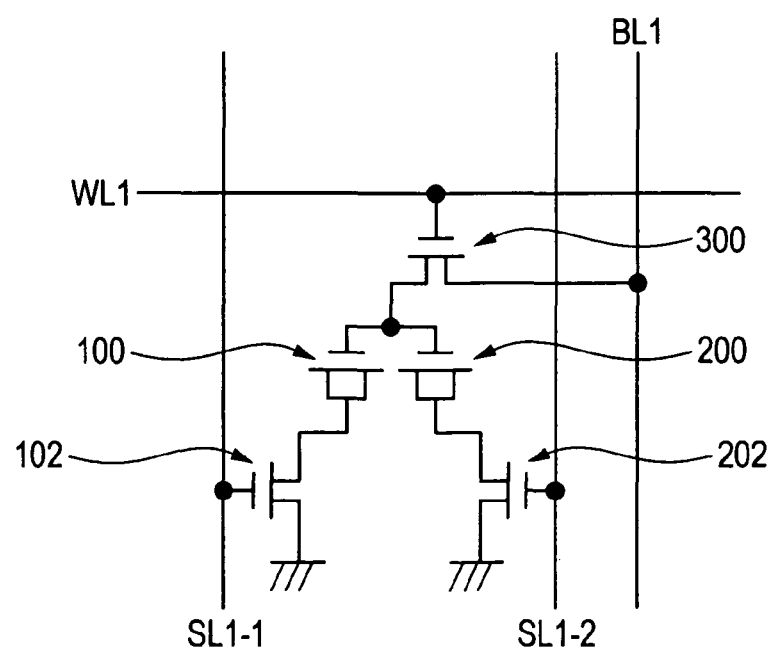
FIG. 16 is a circuit diagram showing a configuration of a semiconductor device according to a fourth embodiment.

FIG. 16 is a circuit diagram showing a configuration of a semiconductor device according to the fourth embodiment. The semiconductor device according to the fourth embodiment is configured similarly to the semiconductor device according to any of the first through third embodiments except the following.

The first diffusion layer 110 of the first semiconductor device 100 is coupled to one of the source and the drain of a transistor 102. The transistor 102 corresponds to the first conductivity type (e.g., n-type). The other one of the source and the drain of the transistor 102 is grounded. The gate electrode is coupled to the first potential control line SL1-1. The second diffusion layer 210 of the second semiconductor device 200 is coupled to one of the source and the drain of a transistor 202. The transistor 202 corresponds to the first conductivity type. The other one of the source and the drain of the transistor 202 is grounded. The gate electrode is coupled to the second potential control line SL1-2. The transistor 102 turns on when the second potential is inputted to the first potential control line 1-1. The transistor 102 turns off when the first potential is inputted to the first potential control line 1-1. The transistor 202 turns on when the fourth potential is inputted to the second potential control line 1-2. The transistor 202 turns off when the third potential is inputted to the second potential control line 1-2.

The following describes how to write "1" to the memory cell or how to form the short circuit section 132 for the first insulation film 130 according to the embodiment. The read/write control section applies the second potential such as the power supply potential (e.g., 3.3 V) to the gate electrode of the transistor 102 through the first potential control line SL1-1. The read/write control section applies the third potential such as the ground potential (e.g., 0.0 V) to the gate electrode of the transistor 202 through the second potential control line SL1-2. As a result, the transistor 102 turns on to ground the first diffusion layer 110 of the first semiconductor device 100. The transistor 202 does not turn on. The second diffusion layer 210 of the second semiconductor device enters a floating state.

The read/write control section inputs a high signal such as 3.3 V to the word line WL1. As a result, the control transistor 300 turns on. The potential of the bit line BL1 is applied to the first electrode 120 of the first semiconductor device 100 and the second electrode 220 of the second semiconductor device 200.

A high signal (7 V according to the example of the drawing) is inputted to the bit line BL1. The high signal has the same potential as that a high signal input to the word line when no writing occurs. Let us suppose that the potential difference (7 V) between the ground potential and the high signal (7 V) input to the bit line BL1 ranges so as to cause insulation breakdown to the first insulation film 130 and that the second diffusion layer 210 remains in a floating state. In this case, the potential of the bit line BL1 increases while the potential is needed to cause insulation breakdown to the second insulation film 230. As a result, the second insulation film 230 is not broken down. The short circuit section 132 is formed only for the first insulation film 130.

The following describes how to write "0" to the memory cell or how to not form the short circuit section 132 for the first insulation film 130. The read/write control section applies the first potential such as the ground potential (e.g., 0.0 V) to the gate electrode of the transistor 102 through the first potential control line SL1-1. The read/write control section applies the fourth potential such as the power supply potential (e.g., 3.3 V) to the gate electrode of the transistor 202 through the second potential control line SL1-2. As a result, the transistor 102 turns on to ground the first diffusion layer 210 of the second semiconductor device 200. The transistor 202 does not turn on. The first diffusion layer 110 of the first semiconductor device enters a floating state.

The read/write control section inputs a high signal such as 3.3 V to the word line WL1. As a result, the control transistor 300 turns on. The potential of the bit line BL1 is applied to the first electrode 120 of the first semiconductor device 100 and the second electrode 220 of the second semiconductor device 200.

A high signal (7 V according to the example of the drawing) is inputted to the bit line BL1. Let us suppose that the potential difference (7 V) between the ground potential and the high signal (7 V) input to the bit line BL1 ranges so as to cause insulation breakdown to the second insulation film 230 and that the first diffusion layer 110 remains in a floating state. In this case, the potential of the bit line BL1 increases while the potential is needed to cause insulation breakdown to the first insulation film 130. As a result, the first insulation film 130 is not broken down. The short circuit section 232 is formed only for the second insulation film 230.

The fourth embodiment can provide the same effects as the first embodiment. The diffusion layer in a floating state is included in the first semiconductor device 100 or the second semiconductor device 200 whichever forms no short circuit section. Compared to the first embodiment, stress is hardly applied to the first insulation film 130 or the second insulation film 230 whichever is free from insulation breakdown. Accordingly, the semiconductor device reliability increases.

The transistors 102 and 202 may be p-type. In this case, the magnitude relation between the potential applied to the first potential control line SL1-1 and the potential applied to the second potential control line SL1-2 is reverse to the above-mentioned example when "1" or "0" is written to the memory cell.

Fifth Embodiment

Figure 17:
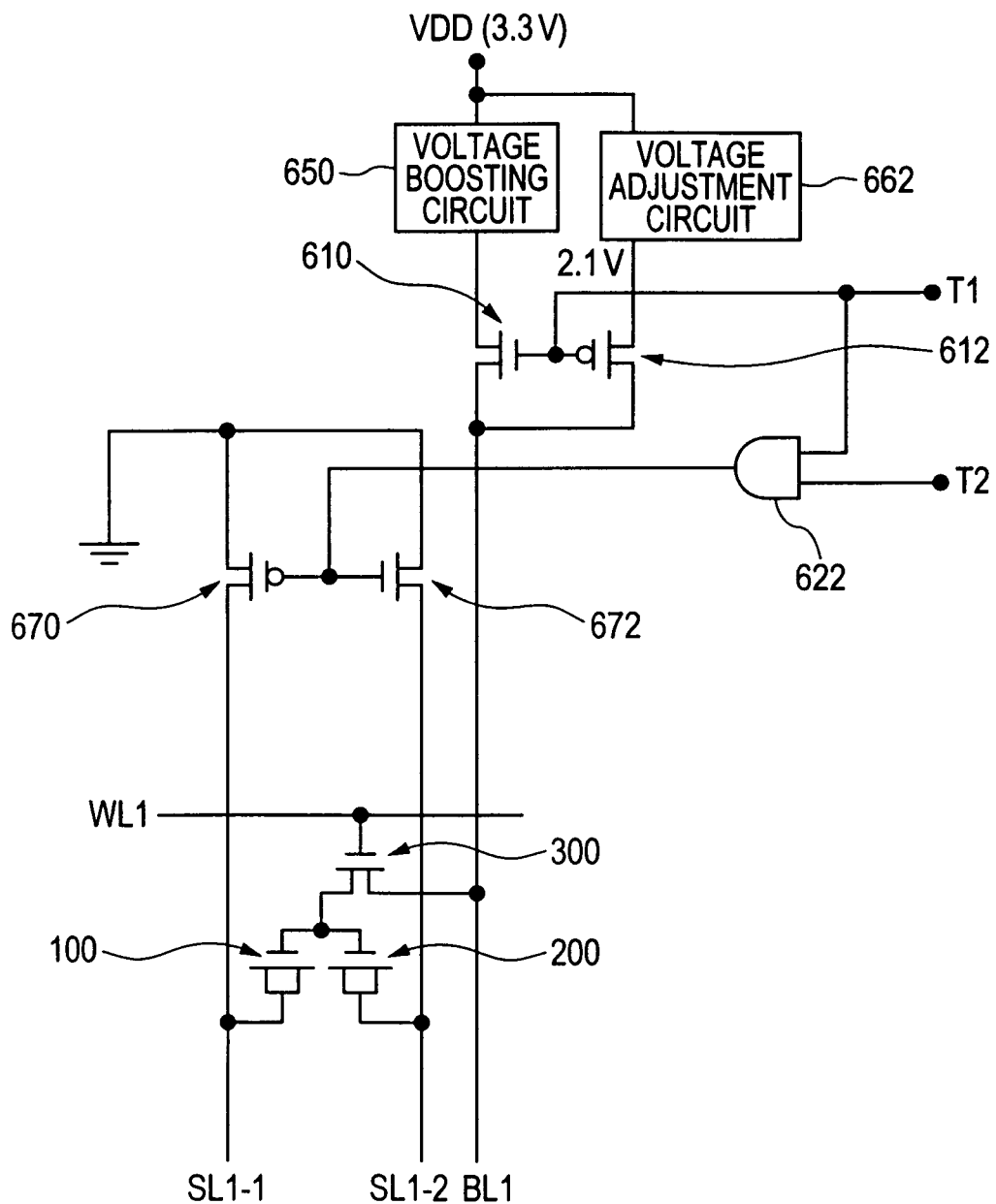
FIG. 17 is a circuit diagram showing a configuration of a semiconductor device according to a fifth embodiment.

FIG. 17 is a circuit diagram showing a configuration of a semiconductor device according to the fifth embodiment. The semiconductor device according to the fifth embodiment is configured similarly to the semiconductor device according to the first embodiment except the configuration of the read/write control section. According to the fifth embodiment, the ground potential is inputted to one of the first potential control line SL1-1 and the second potential control line SL1-2 and the other enters a floating state.

The read/write control section according to the fifth embodiment is configured similarly to the read/write control section shown in FIG. 9 except the following. The read/write control section includes transistors 670 and 672 (second and third write control transistors) instead of the transistors 630, 632, 640, and 642. An AND gate 622 is provided instead of the NAND gate 620 and the inverter 664. The following description assumes the first conductivity type to be n-type and the second conductivity type to be p-type.

The write data input line T2 is coupled to one input terminal of the AND gate 622. An output from the AND gate 622 is coupled to the gate electrode of the p-type transistor 670 and the gate electrode of the n-type transistor 672. One of the source and the drain of the transistor 670 and one of the source and the drain of the transistor 672 are grounded. The other one of the source and drain of the transistor 670 is coupled to the first potential control line SL1-1. The other one of the source and drain of the transistor 672 is coupled to the second potential control line SL1-2.

The write control line T1 is coupled to the gate of the transistor 612 and the gate of the transistor 610 and is also coupled to the other input terminal of the AND gate 622. The AND gate 622 always outputs a low signal regardless of a signal from the write data input line T2 when the write control line T1 issues a low signal. The AND gate 622 outputs a signal from the write data input line T2 when the write control line T1 issues a high signal.

Also in this embodiment, the state where the short circuit section 132 is formed for the first semiconductor device 100 is equivalent to "1". The state where the short circuit section 132 is not formed for the first semiconductor device 100 is equivalent to "0".

In this configuration, a high signal is inputted to the write control line T1 and a low signal is inputted to the write data input line T2 when "1" is written to the memory cell.

Inputting a high signal to the write control line T1 also inputs a high signal to the gate electrodes of the transistors 610 and 612. Of the transistors 610 and 612, only the transistor 610 turns on to input an output potential from the voltage boosting circuit 650 to the bit line BL1. The transistor 612 is also supplied with a high signal but does not turn on because the transistor 612 is p-type.

Inputting a low signal to the write data input line T2 also inputs a low signal to the gate electrodes of the transistors 670 and 672. Of the transistors 670 and 672, only the transistor 670 turns on to ground the first potential control line SL1-1. The second potential control line SL1-2 enters a floating state. In this state, a high signal is inputted to the word line WL1 to turn on the control transistor 300. The potential of the bit line BL1 is then input to the first electrode 120 of the first semiconductor device 100. The first potential control line SL1-1 is grounded. Accordingly, the first insulation film 130 of the first semiconductor device 100 is broken as a insulation breakdown to write "1" to the memory cell.

The potential of the bit line BL1 is also input to the second electrode 220 of the second semiconductor device 200. However, the second potential control line SL1-2 remains a floating state. The potential difference between the floating state and the potential of the bit line BL ranges so as to cause no insulation breakdown to the second insulation film 230. Accordingly, the second insulation film 230 of the second semiconductor device 200 is not broken down.

A high signal is inputted to the write control line T1 and the write data input line T2 when "0" is written to the memory cell.

Inputting a high signal to the write control line T1 also inputs a high signal to the gate electrodes of the transistors 610 and 612. Of the transistors 610 and 612, only the transistor 610 turns on to input an output potential from the voltage boosting circuit 650 to the bit line BL1. The transistor 612 is also supplied with a high signal but does not turn on because the transistor 612 is p-type.

Inputting a high signal to the write data input line T2 also inputs a high signal to the gate electrodes of the transistors 670 and 672. Of the transistors 670 and 672, only the transistor 672 turns on to ground the second potential control line SL1-2. The first potential control line SL1-1 enters a floating state. In this state, a high signal is inputted to the word line WL1 to turn on the control transistor 300. The potential of the bit line BL1 is then input to the first electrode 120 of the first semiconductor device 100. However, the first potential control line SL1-1 remains a floating state. In this state, the potential of the bit line BL1 increases while the potential is needed to cause insulation breakdown to the first insulation film 130. As a result, the first insulation film 130 of the first semiconductor device 100 is not broken down.

The potential of the bit line BL1 is also input to the second electrode 220 of the second semiconductor device 200. However, the second potential control line SL1-2 is grounded. Consequently, the second insulation film 230 of the second semiconductor device 200 is broken down to form the short circuit section 232 (see FIGS. 7A and 7B).

The method of reading information from the first semiconductor device 100 is the same as the method described with reference to FIG. 9 in the first embodiment. As a difference, the AND gate 622 outputs a low signal (ground potential) to turn on only the transistor 670, not the transistor 672.

The fifth embodiment can provide the same effects as the first embodiment. The diffusion layer in a floating state is included in the first semiconductor device 100 or the second semiconductor device 200 whichever forms no short circuit section. Compared to the first embodiment, stress is hardly applied to the first insulation film 130 or the second insulation film 230 whichever is free from insulation breakdown. Accordingly, the semiconductor device reliability increases.

While there have been described specific preferred embodiments of the present invention with reference to the drawings, the embodiments exemplify the invention and the other configurations may be variously used.

What is claimed is:

1. A semiconductor device comprising:
    a substrate;
    a first semiconductor device including a first insulation film formed over the substrate, a first electrode formed over the first insulation film, and a first diffusion layer that is formed over the substrate and is adjacent to at least the first electrode in a planar view;
    a second semiconductor device including a second insulation film formed over the substrate, a second electrode that is formed over the second insulation film and is adjacent to the first electrode, and a second diffusion layer that is formed over the substrate and is adjacent to at least the second electrode in a planar view;
    a bit line;
    a word line;
    a control transistor having one of a source and a drain coupled to the first electrode and the second electrode, the other one of a source and a drain coupled to the bit line, and a gate electrode coupled to the word line;
    a first potential control section that controls a potential of the first diffusion layer; and
    a second potential control section that controls a potential of the second diffusion layer,
    wherein a contact is coupled to the first diffusion layer and is not provided for at least one of a plurality of first regions included in the first diffusion layer divided by the first electrode.

2. The semiconductor device according to claim 1, comprising:
    a short circuit section including the first insulation film and the second insulation film one of which short-circuits the substrate to one of the first electrode and the second electrode.

3. The semiconductor device according to claim 2,
    wherein the first semiconductor device is provided as a memory device that stores information depending on whether the short circuit section is formed;
    wherein the second semiconductor device is provided as a dummy device for the first semiconductor device; and
    wherein at least one set of the first semiconductor device and the second semiconductor device configures one memory cell.

4. The semiconductor device according to claim 3,
    wherein the first potential control section controls to supply the first diffusion layer with one of a first potential and a second potential higher than the first potential;
    wherein the second potential control section controls to supply the second diffusion layer with one of a third potential lower than the second potential and a fourth potential higher than the third potential;
    wherein a potential difference between the first potential and the high signal input to the bit line and a potential difference between the third potential and the high signal range so as to cause insulation breakdown to the first insulation film and the second insulation film; and
    wherein a potential difference between the second potential and the high signal and a potential difference between the fourth potential and the high signal range so as to cause no insulation breakdown to the first insulation film and the second insulation film.

5. The semiconductor device according to claim 4, comprising:
    a write control section for writing to the first semiconductor device and the second semiconductor device,
    wherein the write control section applies the first potential to the first diffusion layer, applies the fourth potential to the second diffusion layer, and inputs a high signal to the bit line when writing 1 to the memory cell; and
    wherein the write control section applies the second potential to the first diffusion layer, applies the third potential to the second diffusion layer, and inputs a high signal to the bit line when writing 0 to the memory cell.

6. The semiconductor device according to claim 4, comprising:
    a read control section for reading from the first semiconductor device, wherein the read control section applies a fifth potential to the first diffusion layer, applies a sixth potential different from the fifth potential to the bit line, and turns on the control transistor; and wherein a potential difference between the fifth potential and the sixth potential ranges so as to cause no insulation breakdown to the first insulation film.

7. The semiconductor device according to claim 4, wherein the third potential equals the first potential.

8. The semiconductor device according to claim 7, wherein the high signal has a higher voltage than a power supply potential of the semiconductor device;

wherein the first potential and the third potential are equivalent to a ground potential; and wherein the second potential and the fourth potential are equivalent to the power supply potential.

9. The semiconductor device according to claim 8, wherein the first potential control section includes a first write control line coupled to the first diffusion layer;

wherein the second potential control section includes a second write control line coupled to the second diffusion layer;

wherein the first potential control section adjusts a potential of the first diffusion layer to one of the first potential and the second potential through the first write control line; and wherein the second potential control section adjusts a potential of the second diffusion layer to one of the third potential and the fourth potential through the second write control line.

10. The semiconductor device according to claim 7, wherein the first potential and the third potential are equivalent to a ground potential; and wherein the second potential and the fourth potential are equivalent to a potential in a floating state.

11. The semiconductor device according to claim 10, comprising:
a first write control line;
a second write control line;
a second control transistor having one of a source and a drain coupled to the first diffusion layer, having the other one of a source and a drain coupled to a ground, and having a gate electrode coupled to the first write control line; and
a third control transistor having one of a source and a drain coupled to the second diffusion layer, having the other one of a source and a drain coupled to a ground, and having a gate electrode coupled to the second write control line,
wherein the first potential control section controls the second control transistor through the first write control line to adjust a potential of the first diffusion layer to one of the first potential and the second potential; and
wherein the second potential control section controls the third control transistor through the second write control line to adjust a potential of the second diffusion layer to one of the third potential and the fourth potential.

12. The semiconductor device according to claim 4, wherein the high signal is inputted from outside.

13. The semiconductor device according to claim 4, comprising:
a power supply line for transmitting a power supply potential input from outside; and
a voltage boosting circuit that boosts a power supply potential input from outside,
wherein the high signal is outputted from the voltage boosting circuit.

14. The semiconductor device according to claim 1, wherein the first diffusion layer is not formed below the first electrode; and
wherein the second diffusion layer is not formed below the second electrode.

15. The semiconductor device according to claim 1, wherein the first diffusion layer is also formed below the first electrode; and
wherein the second diffusion layer is formed below the second electrode.

16. The semiconductor device according to claim 1, wherein the first semiconductor device and the second semiconductor device are provided as an anti-fuse.

17. The semiconductor device according to claim 1, wherein the first electrode crosses the first diffusion layer and the second electrode crosses the second diffusion layer in a planar view.

18. The semiconductor device according to claim 1, wherein the first electrode does not cross the first diffusion layer and the second electrode does not cross the second diffusion layer in a planar view.

19. The semiconductor device according to claim 18, wherein a contact is coupled to the second diffusion layer and is not provided for at least one of a plurality of second regions included in the second diffusion layer divided by the second electrode.

20. The semiconductor device according to claim 1, wherein the second potential control section comprises a second potential control line to control the potential of the second diffusion layer, and
wherein a same potential as that for the bit line is applied to a second potential control line of the second potential control section, and a signal input to the word line during reading has a same potential as that applied to the bit line during reading.

21. A method of writing to a memory unit comprising:
a substrate;
a first semiconductor device including a first insulation film formed over the substrate, a first electrode formed over the first insulation film, a first diffusion layer that is formed over the substrate and is adjacent to at least the first electrode in a planar view;
a second semiconductor device including a second insulation film formed over the substrate, a second electrode that is formed over the second insulation film and is coupled to the first electrode, a second diffusion layer that is formed over the substrate and is adjacent to at least the second electrode in planar view;
a bit line;
a word line; and
a control transistor having one of a source and a drain coupled to the first electrode and the second electrode, the other one of a source and a drain coupled to the bit line, and a gate electrode coupled to the word line,
wherein at least one set of the first semiconductor device and the second semiconductor device configures one memory cell;
wherein a first potential is applied to the first diffusion layer, a fourth potential higher than the first potential is applied to the second diffusion layer, a high signal is inputted to the bit line, and a signal is inputted to the word line to turn on the control transistor when 1 is written to the memory cell;
wherein a second potential higher than the first potential is applied to the first diffusion layer, a third potential lower than the second potential and the fourth potential is applied to the second diffusion layer, a high signal is inputted to the bit line, and a signal is inputted to the word line to turn on the control transistor when 1 is written to the memory cell;

wherein a potential difference between the first potential and the high signal and a potential difference between the third potential and the high signal range so as to cause insulation breakdown to the first insulation film and the second insulation film, wherein a potential difference between the second potential and the high signal and a potential difference between the fourth potential and the high signal range so as to cause no insulation breakdown to the first insulation film and the second insulation film, and wherein a contact is coupled to the first diffusion layer and is not provided for at least one of a plurality of first regions included in the first diffusion layer divided by the first electrode.

22. The method according to claim 21, wherein a contact is coupled to the second diffusion layer and is not provided for at least one of a plurality of second regions included in the second diffusion layer divided by the second electrode.

23. A method of reading information from a memory unit comprising:
    a substrate;
    a first semiconductor device including a first insulation film formed over the substrate, a first electrode formed over the first insulation film, a first diffusion layer that is formed over the substrate and is adjacent to at least the first electrode in a planar view;
    a second semiconductor device including a second insulation film formed over the substrate, a second electrode that is formed over the second insulation film and is coupled to the first electrode, a second diffusion layer that is formed over the substrate and is adjacent to at least the second electrode in planar view;
    a bit line;
    a word line; and
    a control transistor having one of a source and a drain coupled to the first electrode and the second electrode, the other one of a source and a drain coupled to the bit line, and a gate electrode coupled to the word line,
    wherein at least one set of the first semiconductor device and the second semiconductor device configures one memory cell,
    wherein one of the first insulation film and the second insulation film includes a short circuit section that short-circuits one of the first electrode and the second electrode,
    wherein the memory cell stores 1-bit information depending on whether the short circuit section is formed for the first insulation film,
    wherein a fifth potential is applied to the first diffusion layer and a sixth potential different from the fifth potential is applied to the bit line,
    wherein a potential difference between the fifth potential and the sixth potential ranges so as to cause no insulation breakdown to the first insulation film, and
    wherein a contact is coupled to the first diffusion layer and is not provided for at least one of a plurality of first regions included in the first diffusion layer divided by the first electrode.

24. The method according to claim 23, wherein a contact is coupled to the second diffusion layer and is not provided for at least one of a plurality of second regions included in the second diffusion layer divided by the second electrode.

25. A semiconductor device manufacturing method comprising:
    forming, over a substrate, a first semiconductor device including a first insulation film, a first electrode formed over the first insulation film, and a first diffusion layer formed over the substrate so as to be adjacent to at least the first electrode in a planar view;
    forming, over the substrate, a second semiconductor device including a second insulation film, a second electrode formed over the second insulation film so as to be adjacent to the first electrode, and a second diffusion layer formed over the substrate so as to be adjacent to at least the second electrode in a planar view;
    forming a control transistor;
    forming a wiring to couple one of a source and a drain of the control transistor to the first electrode and the second electrode, a bit line coupled to the other one of the source and the drain, and a word line coupled to a gate electrode of the control transistor;
    forming, at a given timing, a first potential control section to control a potential of the first diffusion layer and a second potential control section to control a potential of the second diffusion layer; and
    forming a contact coupled to the first diffusion layer and not provided for at least one of a plurality of first regions included in the first diffusion layer divided by the first electrode.

26. The method according to claim 25, further comprising of forming a contact coupled to the second diffusion layer and not provided for at least one of a plurality of second regions included in the second diffusion layer divided by the second electrode.

* * * * *